United States Patent [19]
Tzu

[11] Patent Number: 5,998,857
[45] Date of Patent: Dec. 7, 1999

[54] SEMICONDUCTOR PACKAGING STRUCTURE WITH THE BAR ON CHIP

[75] Inventor: Chung-Hsing Tzu, Taipei Hsien, Taiwan

[73] Assignee: Sampo Semiconductor Corporation, Tao Yuan Hsien, Taiwan

[21] Appl. No.: 09/132,241

[22] Filed: Aug. 11, 1998

[51] Int. Cl.$^6$ .......................... H01L 23/495; H05K 5/02
[52] U.S. Cl. .................. 257/670; 257/666; 257/671; 361/813
[58] Field of Search ..................... 257/670, 666, 257/671, 674; 438/123; 361/813

[56] References Cited

U.S. PATENT DOCUMENTS

| 4,289,922 | 9/1981 | Devlin | 257/670 |
|---|---|---|---|
| 5,430,331 | 7/1995 | Hamzehdoost et al. | 257/670 |
| 5,521,428 | 5/1996 | Hollingsworth et al. | 257/670 |
| 5,610,437 | 3/1997 | Frechette | 257/670 |
| 5,723,899 | 3/1998 | Shin | 257/670 |

FOREIGN PATENT DOCUMENTS

| 1-236643 | 9/1989 | Japan | 257/670 |
|---|---|---|---|
| 6-53404 | 2/1994 | Japan | 257/670 |

Primary Examiner—Mahshid Saadat
Assistant Examiner—Jhihan B Clark
Attorney, Agent, or Firm—Rosenberg, Klein & Bilker

[57] ABSTRACT

Disclosed is a semiconductor package where at least one tie bar is arranged on the leadframe such that the die to be packaged is attached to the tie bar by binding tape. The problem of gap or delamination will not occur due to the disuse of silver epoxy and die paddle. The processing time can be reduced and the applicability to die is enhanced.

3 Claims, 3 Drawing Sheets

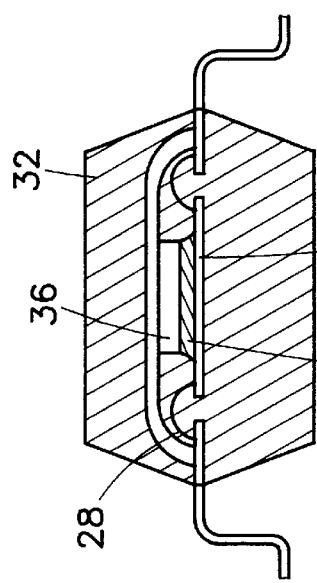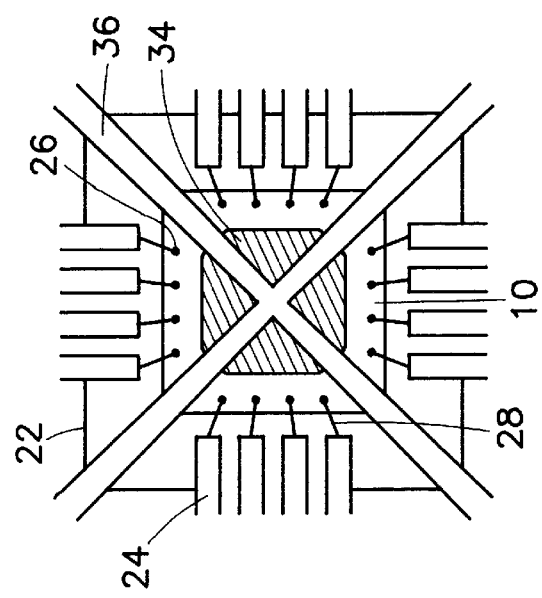

SEMICONDUCTOR PACKAGING STRUCTURE WITH THE BAR ON CHIP

FIELD OF THE INVENTION

The present invention provide an improved semiconductor packaging structure with tie bar, by which the molding compound can compactly seal the chip, the pop-corning of package is prevented, the processing time is reduced, and the applicability of packaging can be enhanced.

BACKGROUND OF THE INVENTION

In recent years, packaging becomes the performance-limiting factor for microelectronic device, and the issues such as size, weight, cost, pin count, and power consumption are important for packaging design. Therefore, the packaging design generally trade off between material, structure, electronic property to obtain a cost effective and reliable design.

FIG. 1 shows the cross section view of a conventional semiconductor package. The die 10 cut from wafer is attached on the paddle 22 of the leadframe 30 and then adhered to the paddle 22 by epoxy 30 or other viscous adhesives. The resulting structure is then encapsulated by a molding compound 32, thus completing the package.

However, in above-mentioned packaging process, delamination or gap is liable to form between the paddle 22 and the molding compound 32 due to the poor adhesion. Therefore, moisture may be entrapped within the package containing gap or delamination. The package may have the problem of crack when subjected to a following on soldering process due to the thermal expansion of the moisture. Moreover, if the amount of the of the epoxy is excessive, the epoxy is liable to ooze out from under the die and mat cause the occurrence of gap or delamination due to the poor adherence between silver epoxy and molding compound. The gap or delamination also can induce the crack of the package.

As shown in FIGS. 2a and 2b, the silver epoxy 30 should be well controlled such that there is no gap formed between die 10 and die paddle 22.

As shown in FIG. 1b, the size of die paddle 22 should be compatible with that of die 10 to be packaged, therefore, the applicability of this kind of leadframe is limited.

Moreover, the processing time is excessively long because it takes long time to cure the silver epoxy 30.

Another packaging scheme referred as lead on chip (LOC) is proposed to overcome above problems. FIGS. 3a and 3b show shows the cross-sectional view and the top view of LOC package, respectively. In this kind of package, the die 10 is directly attached to the inner lead 24 of leadframe 20 by a binding tape 34 and, accordingly, the provision of die paddle is saved. The adhesive force between the silicone die and the molding compound is superior to that between the lead frame and the molding compound. Therefore, the gap of delamination which may cause pop-corning is prevented in LOC package. Moreover, the die 10 is attached to the inner lead 24 by binding tape 34 in stead of silvery epoxy. The processing time is reduced for the elimination of silver epoxy curing step.

However, as shown in FIG. 3b, the die 10 is attached to the inner lead with tape 34. The bond pads 26 of die 10 are accordingly arranged on somewhat central portion of the die 10 in LOC package.

It is an object of the present invention to provide an improved IC package, which has the same effect as LOC package for preventing pop-corning while the applicability is enhanced.

It is another object of the present invention to provide an improved IC package by which the processing time is reduced.

To achieve above objects, the present provides an IC package wherein at least one tie bar is arranged on the leadframe such that the die to be package is attached to the tie bar by binding tape. The problem of gap or delamination will not occur due to the disuse of silver epoxy and die paddle. The processing time can be reduced and the applicability to die is enhanced.

BRIEF DESCRIPTION OF DRAWINGS

FIG. 2a shows a partial cross-sectional view of the semiconductor chip packaging structure of FIG. 1a;

FIG. 5a shows the cross-sectional view of the second preferred embodiment according to the present invention; and FIG. 5b shows the top view of the second preferred embodiment according to the present invention.

Figure 2A:
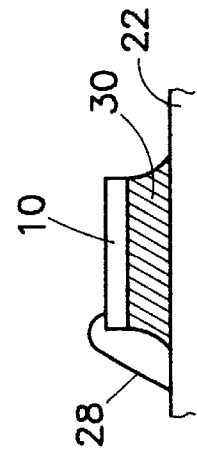
Figure 2B:
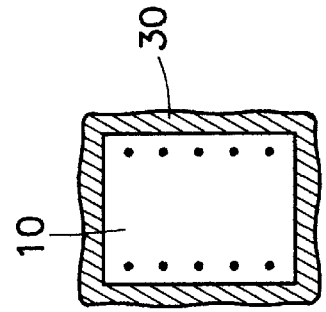
FIG. 2b shows a partial top view of the semiconductor chip packaging structure of FIG. 1b.
Figure 1A:
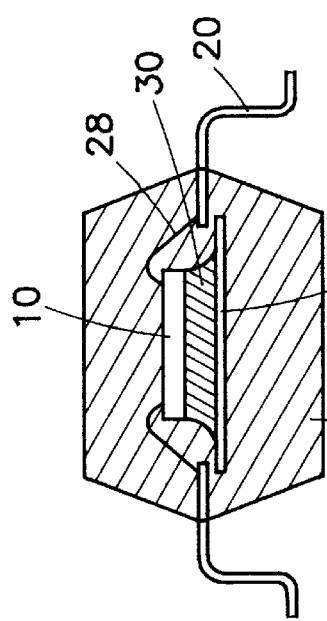
FIG. 1a shows the cross-sectional view of a conventional semiconductor chip packaging structure.
Figure 1B:
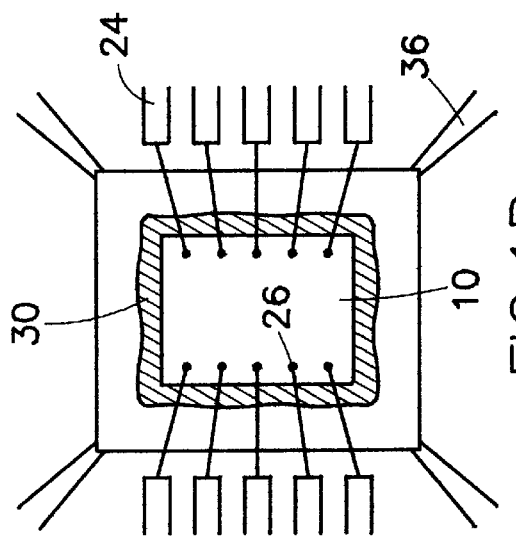
FIG. 1b shows the top view of a conventional semiconductor chip packaging structure.

NUMERAL 10 die
20 lead frame
22 die paddle
24 inner lead
26 bond pad
28 wire
30 silver epoxy
32 molding compound
34 tape
36 tie bar

DETAILED DESCRIPTION OF THE PREFERRED EMBODIMENT

Figure 4A:
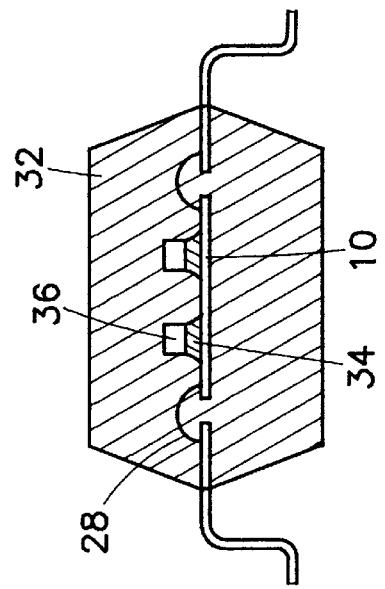
FIG. 4a shows the cross-sectional view of the first preferred embodiment according to the present invention.
Figure 4B:
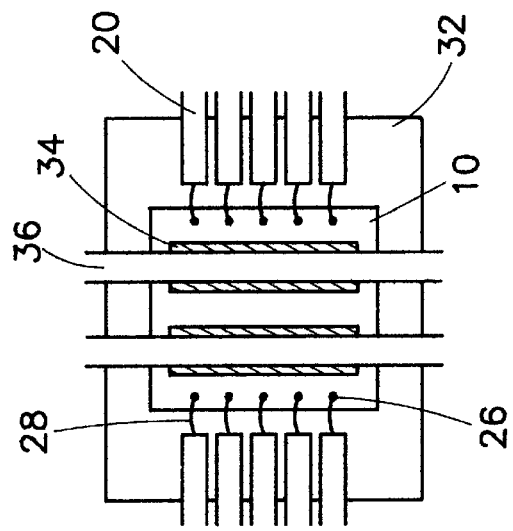
FIG. 4b shows the top view of the first preferred embodiment according to the present invention.
Figure 3A:
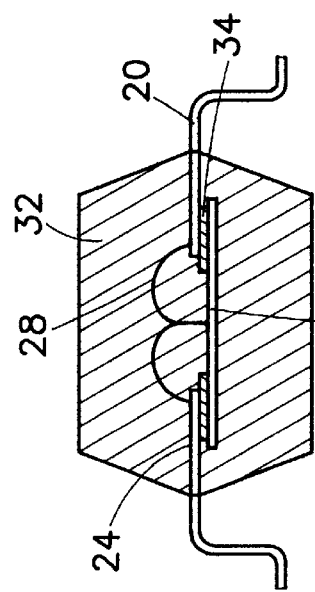
FIG. 3a shows the cross-sectional view of another conventional semiconductor chip packaging structure; LOC (Lead on chip package)
Figure 3B:
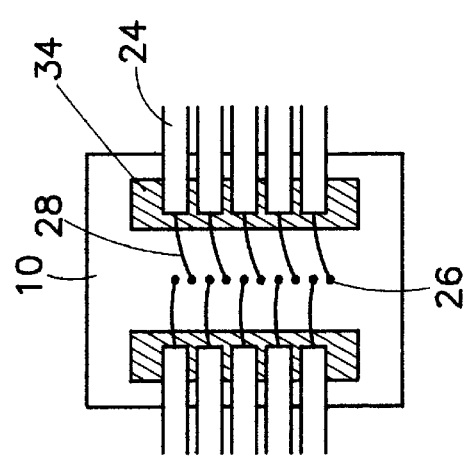
FIG. 3b shows the top view of another conventional semiconductor chip packaging structure; LOC ( Lead on chip package)

FIG. 4a shows the cross-sectional view of the first preferred embodiment according to the present invention. The first embodiment is characterized in that at least one tie bar 36 is arranged on the leadframe 20 and the die 10 is attached to the tie bar 36 with the help of tape 34. FIG. 4b shows the top view of innovative package of FIG. 4a. It is clear that the tie bar 36 according to the present invention should detour the bond pad 26 for not bothering the wire bonding 28.

Moreover, as shown in FIGS. 4a and 4b, the die 10 is attached to the tie bar 36 with tape 34 without employment of silvery epoxy and die paddle. Therefore, the problem of gap or delamination can be prevented and the processing time is reduced.

As also shown in FIGS. 4a and 4b, the bond pads 26 are arranged at somewhat perimeter portion of the die 10 in the inventive packaging structure. Therefore, the inventive packaging structure is advantageous for packaging those dies with bond pad at perimeter and provides broader applicability while has the same effect for preventing popcorn as LOC package.

Moreover, the inventive packaging structure does not adopt a die paddle, therefore, there is less limitation on size of die.

FIGS. 5a and 5b show the cross-sectional view and top view of another preferred embodiment according to the present invention. The second preferred embodiment is designed for those dies with bond pad around four lateral sides. As can be more clearly seen from FIG. 5b, the tie bar 36 should also detour the bond pad for not bothering the wire bonding.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A semiconductor packaging structure having a chip mounted to a tie bar, comprising:
    a lead frame having a pair of opposing ends,
    at least one strip-like tie bar extending between said opposing end of said lead frame,
    a die disposed between said opposing ends of said lead frame and attached to a lower surface of said at least one tie bar along substantially an entire length of said die, said tie bar thereby extending over an upper surface of die, and
    a binding tape positioned between said lower surface of said at least one tie bar and said die to adhere said die to said tie bar.

2. The semiconductor packaging structure as recited in claim 1, further including a pair of said tie bars extending between opposing ends of said lead frame and symmetrically attached to said die in substantially parallel relationship.

3. The semiconductor packaging structure as recited in claim 1, further including a pair of said tie bars extending between opposing ends of said lead frame in crossing interrelation each with respect to the other.

* * * * *